United States Patent [19]

Mii

[11] Patent Number: 5,781,073
[45] Date of Patent: Jul. 14, 1998

[54] TEMPERATURE COMPENSATION METHOD FOR AN OUTPUT FREQUENCY DRIFT OF AN OSCILLATOR

[76] Inventor: Adam Mii, 3 Fl., No. 1, Fuhsing N. Rd., Taipei, Taiwan

[21] Appl. No.: 685,684

[22] Filed: Jul. 24, 1996

[51] Int. Cl.$^6$ ............................................... H03L 1/00
[52] U.S. Cl. ................. 331/44; 331/66; 331/68; 331/176
[58] Field of Search .................. 331/68, 66, 176, 331/44

[56] References Cited

U.S. PATENT DOCUMENTS 4,746,879  5/1988  Ma et al. ............................. 331/176
5,604,468  2/1997  Gillig ................................... 331/176

*Primary Examiner*—Siegfried H. Grimm
*Attorney, Agent, or Firm*—Bacon & Thomas

[57] ABSTRACT

A temperature compensation apparatus for an oscillator includes an oscillator having an output for generating a clock signal with a frequency identical to the oscillating frequency of the oscillator, a memory for storing a frequency compensation lookup table based on the relationship between output frequencies of the oscillator and the environmental temperature variations, a temperature detector for detecting the environmental temperature variations, a central processing unit for selecting a rating output frequency of the oscillator, acquiring a frequency compensation value from the frequency compensation lookup table stored in the memory in response to a detected environmental temperature, and converting the frequency compensation value into a corresponding compensation signal, and a compensation circuit receiving an output signal of the oscillator and a compensation signal from the CPU for compensating a deviation between the output frequency of the oscillator and the rating frequency and outputting a frequency signal close to the rating frequency of the oscillator.

11 Claims, 3 Drawing Sheets

TEMPERATURE COMPENSATION METHOD FOR AN OUTPUT FREQUENCY DRIFT OF AN OSCILLATOR

BACKGROUND OF THE INVENTION

The present invention relates to an oscillator, and particularly to a method for compensating frequency drift in an oscillator.

A clock circuit is a significantly important device in digital circuits for synchronizing different digital apparatus and time setting etc. Thus, there is a high demand in that a corresponding clock signal generated by the clock signal has to be of high precision, otherwise, the overall performance of the corresponding apparatus will be substandard.

Crystal oscillators are commonly used oscillators in a general timing apparatus, however, an output frequency of the oscillator will often drift in response to a change in environmental temperature.

It is known that a Caesium clock yields high precision in clock outputs, however, the cost of a Caesium clock is extremely high. An alternative method for pursuing high precision of clock outputs is to apply a thermostatic box which houses the oscillator, however, as such an approach additionally requires a temperature regulator, it will consequently consume more electric power and speed up the aging of the oscillator.

SUMMARY OF THE INVENTION

An object of the present invention is to provide a temperature compensation method for stabilizing an output frequency of an oscillator without drift resulting from the environmental temperature variation.

Another object of the present invention is to provide a temperature compensation apparatus composed of a plurality of electronic components with low cost.

In accordance with one aspect of the present invention, the temperature compensation method for an output frequency drift of an oscillator comprises the steps of:

a) selecting a rating frequency of a desired oscillator;

b) measuring the output frequencies of a plurality of potentially selected oscillators in response to various changes of the environmental temperature so as to establish a frequency compensation lookup table;

c) continuously detecting the changes in the environmental temperature;

d) acquiring a corresponding frequency compensation value from the frequency compensation table based on the presently-detected environmental temperature;

e) converting the acquired compensation value into a corresponding compensation signal; and f) compensating for a deviation between the present output frequency and the rating frequency output of the oscillator.

In accordance with another aspect of the present invention, the temperature compensation apparatus includes an oscillator having an output for generating a clock signal with a frequency identical to the oscillating frequency of the oscillator, a memory for storing a frequency compensation lookup table based on the relationship between output frequencies of the oscillator and the environmental temperature variations, a temperature detector for detecting the environmental temperature variations, a central processing unit (CPU) for selecting a rating output frequency of the oscillator, acquiring a frequency compensation value from the frequency compensation lookup table stored in the memory in response to a detected environmental temperature, and converting the frequency compensation value into a corresponding compensation signal, a compensation circuit receiving an output signal of the oscillator and a compensation signal from the CPU for compensating a deviation between the output frequency of the oscillator and the rating frequency and outputting a frequency signal close to the rating frequency of the oscillator.

Other objects, advantages, and novel features of the invention will become more apparent from the following detailed description when taken in conjunction with the accompanying drawings.

DETAILED DESCRIPTION OF THE PREFERRED EMBODIMENT

Before the detailed description of the preferred embodiment, we note that each of commercially available crystal oscillators had been proceeded with a plurality of tests before becoming available on the markets. These tests could very possibly include a temperature acceleration and a burn-in test.

When proceeding with a temperature acceleration on oscillators, hundreds of oscillators are placed within a temperature chamber and the temperature is slowly increased within the temperature chamber. Corresponding output frequencies in response to the temperature variation are dictated by a personal computer (PC) as to create a frequency compensation lookup table to be stored within a memory, such as a floppy disc for further utilization.

When proceeding with a burn-in test, the oscillators are placed within a oven for few days as to simulate the oscillator operating at room temperature over a number of years such that a characteristic curve can be derived and from which a plurality of characteristic factors can be stored within a memory for further utilization.

Figure 1:
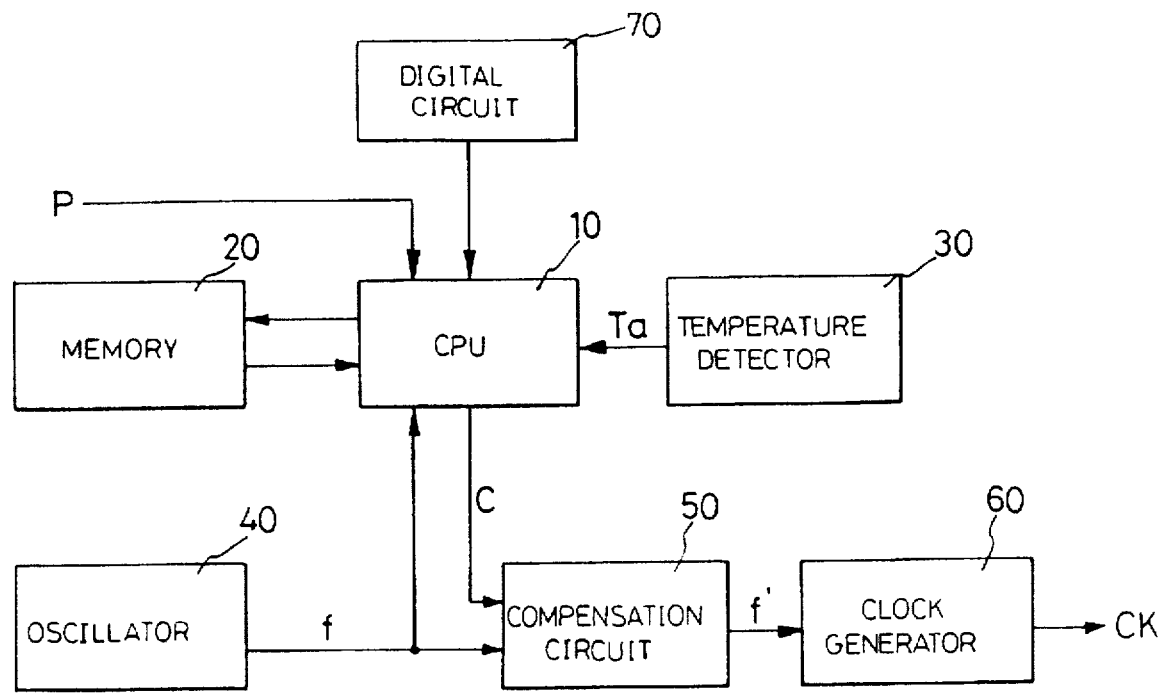
FIG. 1 is a block diagram of the temperature compensation apparatus for an oscillator in accordance with the present invention.

Referring to FIG. 1, a block diagram of the temperature compensation apparatus is shown. The temperature compensation apparatus includes a central processing unit (CPU) 10, a memory 20, a temperature detector 30, an oscillator 40, a compensation circuit 50, and a clock generator 60.

The memory 20 is provided for storing a frequency compensation lookup table and characteristic factors derived from the previous tests. For example, if a crystal oscillator has a rating frequency of 32,768 Hz at a room temperature and if the environmental temperature rises to 40° C., the output frequency is raised to 32,769 Hz. Then, this frequency compensation apparatus has to proceed with a −1 Hz compensation so as to keep the output frequency in accordance with the rating frequency. A frequency difference of is equal to the actual frequency output minus the rating frequency of the oscillator under a given temperature. If the frequency difference αf is positive, this represents the output frequency of the oscillator has to be decreased by said difference αf, such a case is hereinafter referred to as positive compensation. On the contrary, if a negative αf is acquired, the output frequency of the oscillator has to be increased by said frequency difference αf, such a case is referred to as negative compensation. In the case where the αf is a decimal fraction, such as −0.13, the compensation may be accomplished by pulsing thirteen pulses per hundred seconds.

Referring back to FIG. 1, the temperature detector 30 will continuously detect the variation in environmental temperatures and transmit a detected temperature Ta to the CPU 10. The CPU 10 will then acquire a corresponding frequency compensation value from the memory 20 and output a corresponding signal to the compensation circuit 50 for compensating the difference in frequency output. If the detected temperature Ta is not in the frequency compensation lookup table, an interpolation method or an extrapolation method may be applied to accomplish a vector table so as to derive a compensation value which is closest to the detected temperature.

Figure 2:
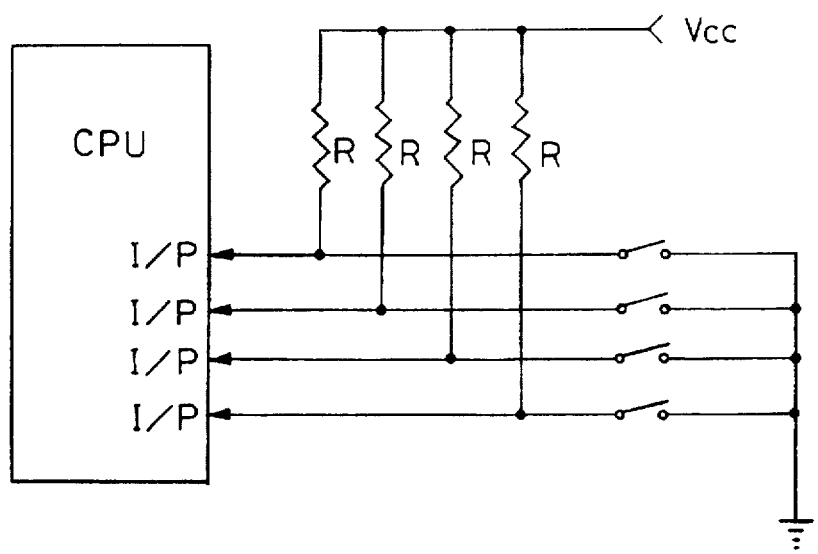
FIG. 2 is a circuit diagram of a digital circuit in FIG. 1.

After previous compensation, the digital circuit 70 shown is used to input a final calibration value to the CPU 10 for adjusting the actual frequency output to the rating frequency. A detail circuit is shown in FIG. 2.

Figure 3:
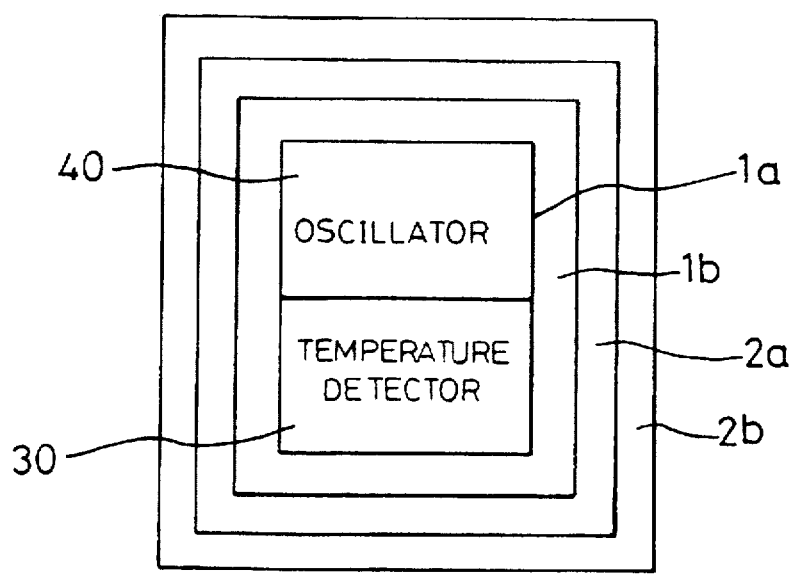
FIG. 3 is a schematic view showing a combination of an oscillator and a temperature detector in accordance with the present invention.

For the purpose of actually detecting the real temperature of the oscillator 40, the temperature sensor 30 and the oscillator 40 are tightly coupled together and enclosed by a plurality of encapsulating layers as shown in FIG. 3. The temperature sensor 30 and the oscillator 40 are enclosed within a first layer 1a composed of a higher thermal conductivity such as copper or aluminum and the first layer 1a is then enclosed by a second layer 1b composed of a lower thermal conductivity such as asbestos. A third layer 2a and a fourth layer 2b respectively having a higher thermal conductivity and a lower thermal conductivity as mentioned are sequentially encapsulated on the second layer 1b. Such an arrangement is used to minimize the temperature difference between the oscillator 40 and the temperature detector 30.

Figure 4:
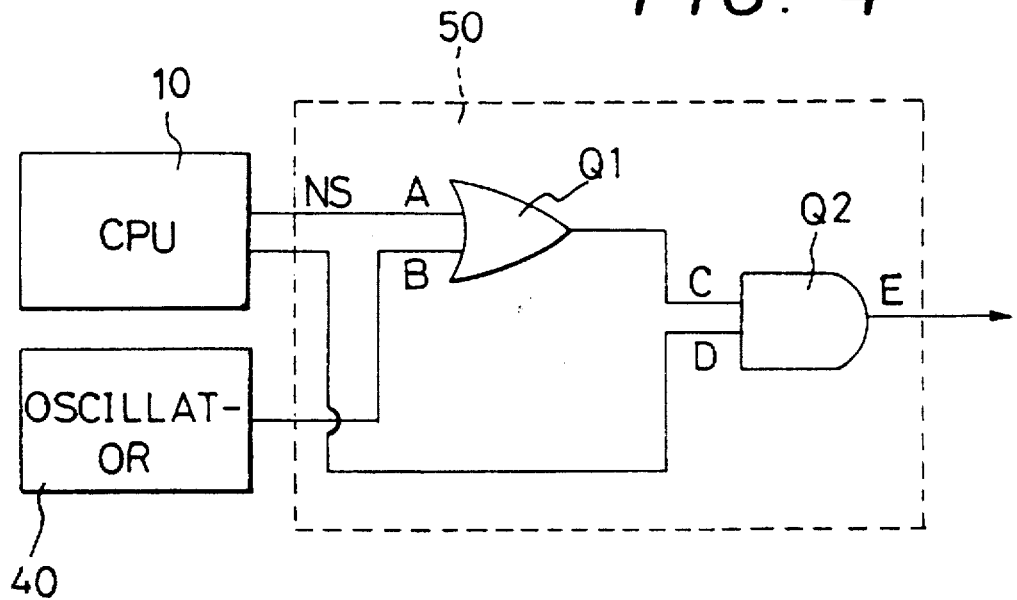
FIG. 4 is a circuit diagram of a compensation circuit in FIG. 1.

Referring to FIG. 4, a circuit diagram of compensation circuit 50 for implementing a positive compensation and a negative compensation is shown. The compensation circuit 50 includes an OR gate Q1 having two inputs respectively receiving an output signal B from the oscillator 40 and a first signal A from the CPU 10 for outputting a negative compensation signal C and an AND gate Q2 having two inputs respectively receiving the negative compensation signal C from the OR gate Q1 and a second signal D from the CPU 10 for outputting a positive compensation signal E. The signals A, D from the CPU 10 correspond to the frequency difference αf as previously mentioned.

Figure 5:
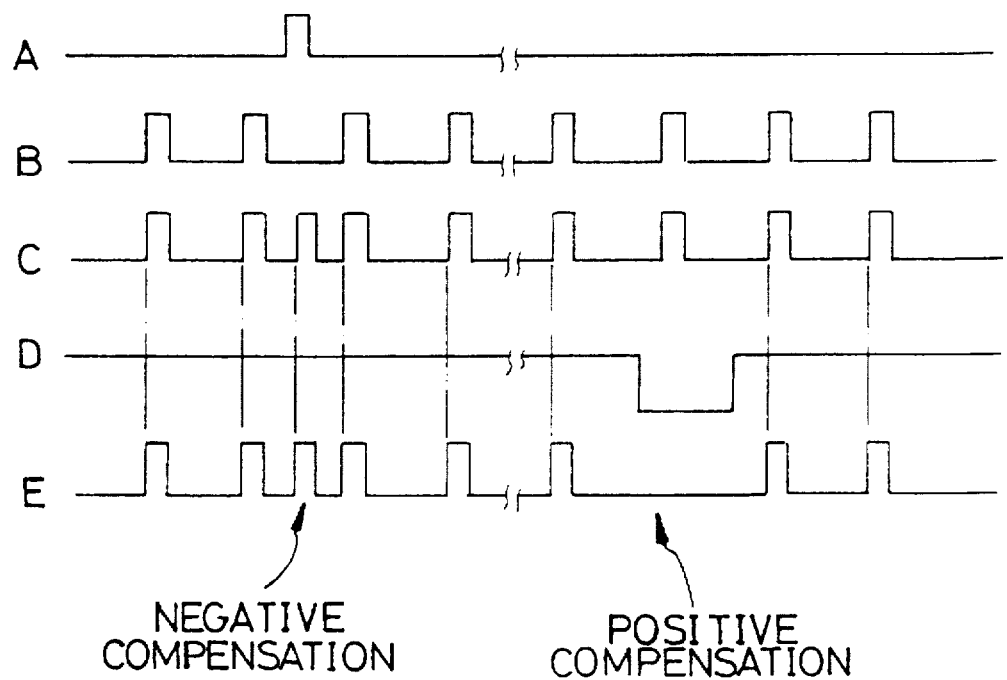
FIG. 5 is a timing diagram showing related signals on the circuit.

FIG. 5 is a timing diagram showing the relationship of the signals corresponding to the symbols A, B, C, D, and E in FIG. 4. IF the CPU 10 outputs a signal A representing the negative compensation, then between the two consecutive pulses, output of the compensation circuit 50 will be inserted more pulses. On the contrary, if the CPU 10 outputs a signal D representing the positive compensation, then the pulses between the two consecutive pulses output of the compensation circuit 50 will be decreased. Further, the signal A is an active-high signal, the signal D is an active-low signal, and the two signals are not active at the same time.

Referring back to FIG. 1, an output signal from the compensation circuit 50 is then sent to the clock generator 60 thereby to generate a desired clock signal CK. As the clock generator 60 is known it is therefore not described in detail here for brevity.

Additionally, the memory 20 can store the characteristic factors derived from the burn-in test mentioned, thus, the temperature compensation apparatus may compensate the frequency from time to time.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A temperature compensation method for an output frequency drift of an oscillator comprising the steps of:
   a) selecting a rating frequency of said oscillator;
   b) measuring the output frequencies at various temperatures of said oscillator to determine the relationship between output frequencies and the various temperatures so as to establish a frequency compensation lookup table;
   c) continuously detecting the changes in the environmental temperature;
   d) acquiring a corresponding frequency compensation value from the frequency compensation table based on the presently-detected environmental temperature;
   e) converting the acquired compensation value into a corresponding compensation signal; and
   f) determining whether the compensation signal is positive or negative, if the compensation signal is positive, then a corresponding number of output pulses of the oscillator is deleted and if the compensation signal is negative, then a corresponding number of pulses are added to the output pulses of the oscillator, thereby compensating for a deviation between the present output frequency and said preselected rating frequency of the oscillator.

2. The method as claimed in claim 1, wherein the step of deleting the output pulse of the oscillator is accomplished by a logical AND gate.

3. The method as claimed in claim 1, wherein the step of adding pulses to the pulse output of the oscillator is accomplished by a logical OR gate.

4. The method as claimed in claim 1, further comprises the step of forecasting the characteristic curve deriving from a burn-in test.

5. A temperature compensation apparatus for an oscillator comprising: an oscillator having an output for generating a clock signal with a frequency identical to the oscillating frequency of the oscillator;

a memory for storing a frequency compensation lookup table based on the relationship between output frequencies of the oscillator and the environmental temperature variations;

a temperature detector for detecting the environmental temperature variations; a central processing unit (CPU) for selecting a rating output frequency of the oscillator, acquiring a frequency compensation value from the frequency compensation lookup table stored in the memory in response to a detected environmental temperature, and converting the frequency compensation value into a corresponding compensation signal; and a compensation circuit for receiving an output signal of the oscillator and a compensation signal from the CPU for compensating a deviation between the output frequency of the oscillator and the rating frequency and outputting a frequency signal by adding or subtracting an appropriate number of output pulses to compensate for any change in the frequency of the oscillator from its rating frequency.

6. The apparatus as claimed in claim 5, wherein said compensation circuit includes a logical OR gate and a logical AND gate.

7. The apparatus as claimed in claim 5, wherein the temperature detector is tightly attached to the oscillator.

8. The apparatus as claimed in claim 5, wherein the temperature detector and the oscillator are encapsulated with a first layer with a first thermal conductivity and the first layer is then encapsulated with a second layer with a second thermal conductivity.

9. The apparatus as claimed in claim 8, wherein the first thermal conductivity of the first layer is higher than the second thermal conductivity of the second layer.

10. The apparatus as claimed in claim 9, wherein the second layer is further encapsulated with a third layer having the first thermal conductivity and the third layer is further encapsulated with a fourth layer having the second thermal conductivity.

11. The apparatus as claimed in claim 5, further comprising a digital circuit connected to the CPU to input a final calibration value to the CPU for adjusting the actual frequency output of the oscillator to the rating frequency, and wherein said digital circuit includes jumper switches.

* * * * *